United States Patent [19]

Metz, Jr.

[11] Patent Number: 5,173,839
[45] Date of Patent: Dec. 22, 1992

[54] HEAT-DISSIPATING METHOD AND DEVICE FOR LED DISPLAY

[75] Inventor: Robert S. Metz, Jr., East Setauket, N.Y.

[73] Assignee: Grumman Aerospace Corporation, Bethpage, N.Y.

[21] Appl. No.: 846,614

[22] Filed: Mar. 5, 1992

Related U.S. Application Data

[63] Continuation-in-part of Ser. No. 625,243, Dec. 10, 1990, abandoned.

[51] Int. Cl.$^5$ ............................................. H05H 7/20
[52] U.S. Cl. .................................... 361/387; 361/346; 361/386
[58] Field of Search .................. 361/346, 363, 386–389

[56] References Cited

U.S. PATENT DOCUMENTS 4,574,330  3/1986  Cohen et al. ...................... 361/388

FOREIGN PATENT DOCUMENTS 1178479  9/1964  Fed. Rep. of Germany ...... 361/388
2126014  3/1984  United Kingdom ............... 361/388

Primary Examiner—Gregory D. Thompson
Attorney, Agent, or Firm—Richard G. Geib; Daniel J. Tick

[57] ABSTRACT

A strip of alumina is thermally bonded to the under surface of an LED display by a thermally conductive adhesive. A thermally conductive front panel is placed in thermal contact surrounding the front surface of the display. A double sided, thermally conductive pressure-sensitive tape is used to bond a heatsink in thermal contact with the alumina. The heatsink is in thermal contact with the front panel and dissipates heat from the display via the alumina, the heatsink and the front panel.

8 Claims, 4 Drawing Sheets

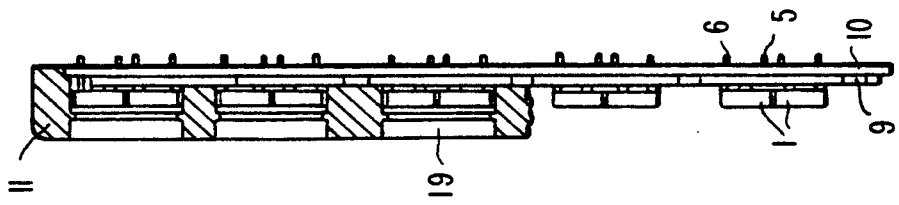
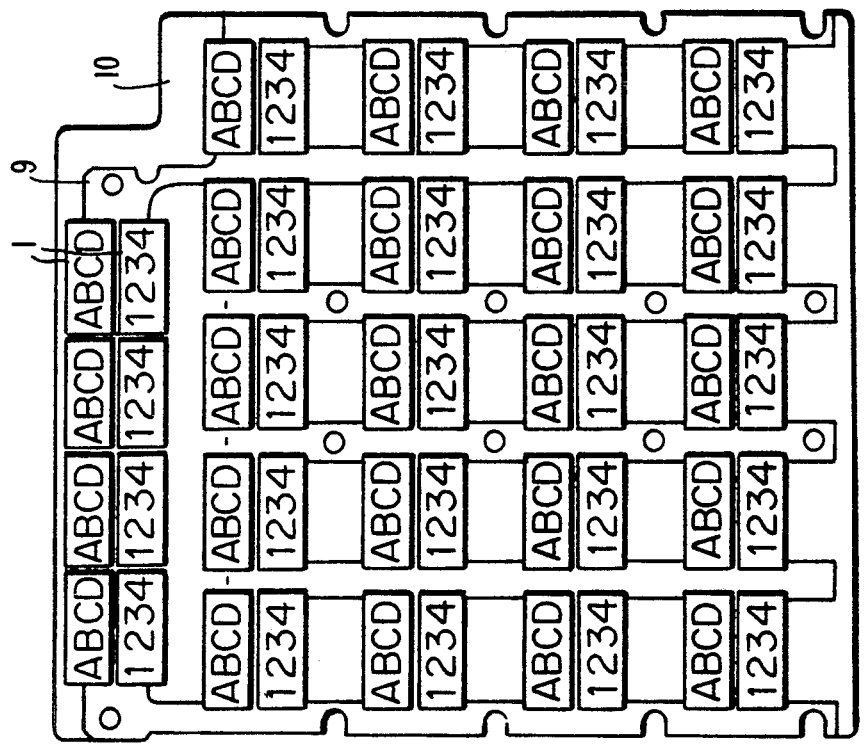
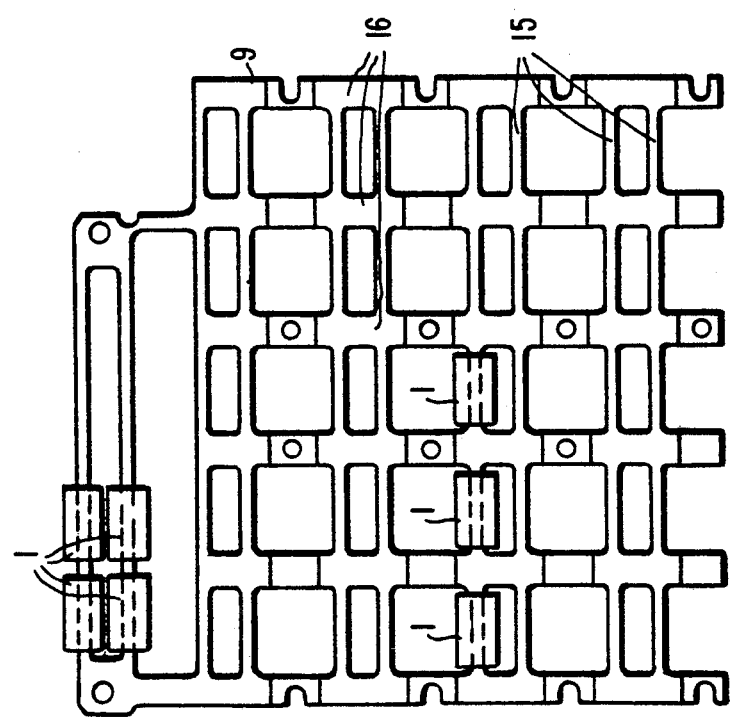
FIG. 7
FIG. 6
FIG. 5

HEAT-DISSIPATING METHOD AND DEVICE FOR LED DISPLAY

BACKGROUND OF THE INVENTION

This is a continuation-in-part of application Ser. No. 07/625,243, filed Dec. 10, 1990, now abandoned for Heating-Dissipating Device For LED DISPLAY.

The present invention relates to a heat-dissipating method and device for a light emitting diode (LED) display. More particularly, the invention relates to a method and device for removing heat from LED display chips and dissipating the heat through the front panel of the display.

A primary consideration in the use of LED chips in a display panel is power, or heat, dissipation and subsequent thermal design. In a military environment the equipment is often required to operate at high ambient temperatures such as, for example, 71° C., with little or no air flow. To insure reliable operation of the LED integrated circuit, it has been found necessary to limit the junction temperature to less than 80° C. The light output is a function of temperature, decreasing 1.5% for each 1° C. increase in junction temperature. It therefore becomes increasingly difficult to efficiently dissipate heat as the number of chips on the LED display increases. Serious heat transfer or conduction problems arise when a plurality of densely packaged display chips are used.

The interconnection leads of LED displays are bent in an "L" shape and attached by brazing to pads on the under surface, which is that spaced from and opposite the front panel. The under surface is that from which heat must be dissipated (FIG. 3). The interconnection leads on the under surface prevent the use of a metal heat sink due to the possibility of an electrical short-circuit between said leads (FIG. 3). Thus, for example, when a 0.100 inch wide ladder type heatsink is used, as suggested by the manufacturer of the display chips, there is a potential for an electrical short-circuit with the formed leads which straddle the heatsink. The formed leads leave a space of 0.110±0.005 inch on the under surface where the heatsink makes contact. The maximum acceptable heatsink width, considering all tolerances and clearances, is 0.050 inch. This is insufficient for adequate heat transfer. The design of the chip does not permit sufficient contact area for efficient heatsinking.

Another heat dissipation problem occurs when a multitude of LED display chips are included in a display. These chips are generally arranged in a plurality of horizontal rows. When the chips are stacked in a horizontal row, a condition is created wherein heat is conducted along the length of a heatsink until it reaches a conductive sidewall, or chassis. This results in an additive, series, heat load with hot spots near the displays in the center of a board. This method derates the integrated circuit (IC) limiting operation at elevated ambient temperatures.

The principal object of the invention is to provide an efficient heat-dissipating method for LED displays which effectively conducts heat away from the individual chips and dissipates it efficiently, thereby keeping the junction temperatures low and preventing hot spots from forming in the display arrangement.

An object of the invention is to provide a heat-dissipating device for a LED display, which device functions efficiently, effectively, and reliably to dissipate heat from the display.

Another object of the invention is to provide an effective method of forming a low thermal resistance heat path to conduct heat away from LED display chips without shorting out the devices interconnecting leads.

Still another object of the invention is to provide an efficient heat transfer radiator for a LED display, which radiator also functions as the front panel of the display.

Yet another object of the invention is to provide a heat-dissipating device for a LED display, which device is inexpensive in manuafacture and installable with rapidity, facility and convience.

Another object of the invention is to provide a method of dissipating heat from a LED display, which method functions efficiently, effectively and reliably to dissipate heat from the display.

Still another object of the invention is to provide a method of dissipating heat from a LED display, which method has few and simple steps.

Yet another object of the invention is to provide a method of dissipating heat from a LED display, which method may be undertaken with rapidity, facility and convenience.

Another object of the invention is to provide a heat-dissipating device for a LED display, which device is simple in structure, functions efficiently, effectively and reliably to dissipate heat form the display and is inexpensive in manufacture and installable with rapidity, facility and convenience.

Still another object of the invention is to provide a method of dissipating heat from a LED display, which method functions efficiently, effectively and reliably to dissipate heat from the display, has few and simple steps and may be undertaken with rapidity, facility and convenience.

BRIEF SUMMARY OF THE INVENTION

In accordance with the invention, a heat-dissipating device for a LED display comprises a strip of alumina which is laid across the under surface of the display and bonded to such under surface via thermally conductive adhesive. The adhesive film may comprise a glass supported, thermally conductive, electrically insulative epoxy film.

The alumina is positioned with a thickness and a width such that any metallic heat distribution grid, such as a ladder type heatsink, will not come into contact with the LED interconnect leads and cause a possible electrical short-circuit.

A strip of double sided, thermally conductive, pressure-sensitive tape is bonded to the spaced opposite surface of the alumina strip and thermally bonds the alumina to the heat distribution grid. The double sided tape ensures that no thermal voids remain when the LED display straddles the heat distribution grid and the leads are soldered to the PC board.

Heat conducted from the under surface of the LED display is transmitted through the adhesive, the alumina and the double sided tape to the heat distribution grid. In the grid, the heat is conducted in two directions. The heat distribution grid comprises a first plurality of spaced substantially parallel heat conducting elements. A second plurality of spaced substantially parallel heat conducting elements are substantially perpendicular to the first plurality of elements and substantially coplanar therewith to form a two-dimensional grid.

Since multiple LED displays are more widely used than single LED displays, the additional heat generated must in turn be further dissipated from the heat distribution grid. In accordance with the invention, additional heat is dissipated via a metallic front panel placed above the displays. The front panel also serves as a protective shroud. The under surface of the front panel extends downward to make contact with the heat distribution grid in a multiplicity of places. The multiplicity of extending parts of the under surface of the front panel provide effective paths substantially perpendicular to the grid through which the heat dissipates to the front panel mass and ultimately to the outside, or immediate environment.

The use of the front panel for heat distribution results in heat being drawn away from the interior of the entire display assembly where additional heat may cause damage to adjacent PC card assemblies. The method of the invention is thus an efficient and effective means to transfer heat from multiple LED displays without greatly affecting the thermal design of associated circuitry.

BRIEF DESCRIPTION OF THE DRAWINGS

In order that the invention may be readily carried into effect, it will now be described with reference to the accompanying drawings wherein:

FIG. 5 is a top plan, on a reduced scale, of the embodiment of FIG. 1 of the heat-dissipating device of the invention;

FIG. 6 is a top plan, on a reduced scale, of the heat-dissipating device of the invention;

FIG. 7 is a side view, on a reduced scale, of the embodiment of FIG. 6;

DETAILED DESCRIPTION OF PREFERRED EMBODIMENT

Figure 1:
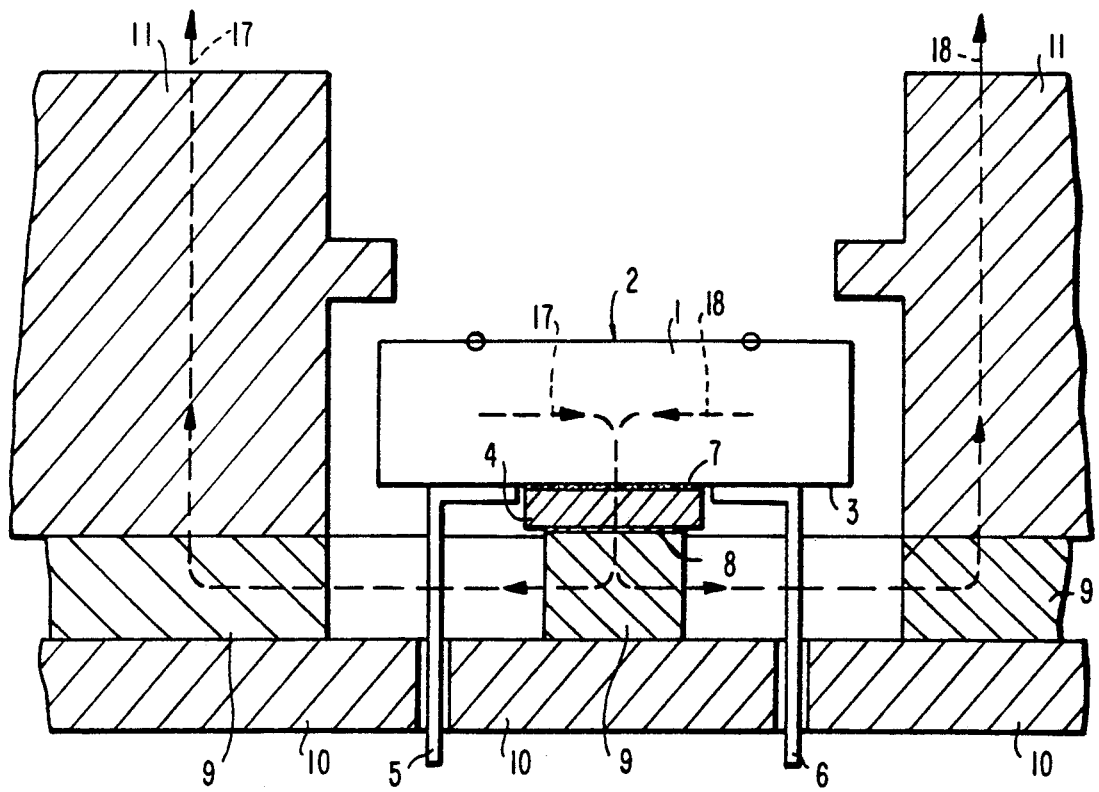
FIG. 1 is a cross-sectional view of an embodiment of the heat-dissipating device of the invention.
Figure 2:
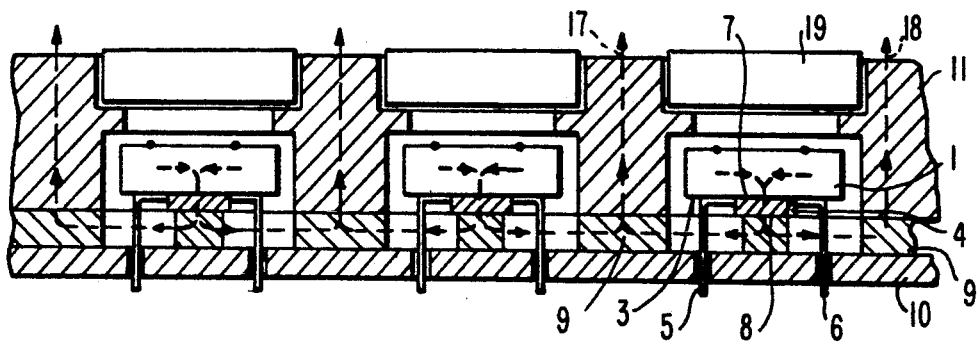
FIG. 2 is a cross-sectional view, on a reduced scale, of the embodiment of FIG. 1 of the heat-dissipating device of the invention.
Figure 3:
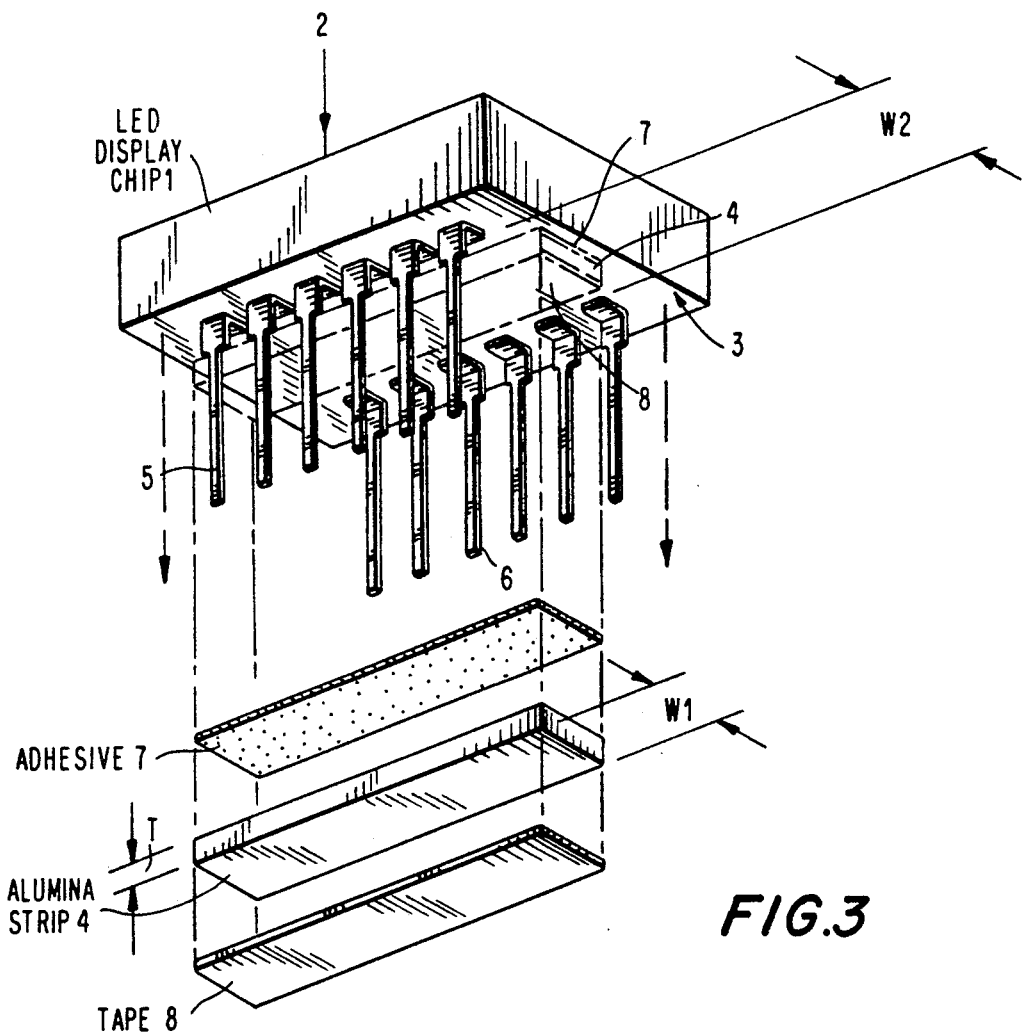
FIG. 3 is a perspective exploded view of some of the components of the embodiment of FIG. 1 of the heat-dissipating device of the invention.

The heat-dissipating device of the invention, shown in FIGS. 1, 2, 4 and 7, has a LED display or display chip 1 (FIGS. 1 to 8) having a front or display surface 2 (FIGS. 1 and 3) and a spaced opposite under surface 3 (FIGS. 1 to 3).

In accordance with the invention, the heat-dissipating device comprises a strip of alumina 4 (FIGS. 1 to 4) thermally bonded to the surface 3 of the display 1. The alumina 4 is preferably thermally conductive 96% $Al_2O_3$ and has a thickness T and width W1 (FIG. 3) sufficient to prevent any metallic heat distribution grid, such as, for example, a ladder type heatsink, from coming into contract with the interconnect leads 5 and 6 (FIGS. 1 to 3 and 7) of the LED display 1. This prevents a possible short-circuit by preventing bridging of the width W2 (FIG. 3) on the under surface 3 of the display 1.

The alumina 4 is thermally bonded to the under surface 3 of the display 1 by a thermally conductive adhesive 7 (FIGS. 1 to 4) which may consist of a glass supported, thermally conductive, electrically insulated epoxy film.

A strip of double sided, thermally conductive, pressure-sensitive tape 8 (FIGS. 1 to 4) is bonded to the spaced opposite surface of the alumina strip 4, opposite the surface of said alumina strip bonded to the display 1. The double sided tape 8 thermally bonds the alumina 4 to a heatsink or heat distribution grid 9 (FIGS. 1, 2 and 4 to 8) and also ensures that no thermal voids remain when the LED display 1 straddles said heat distribution grid.

The leads 5 and 6 of the LED display 1 are electrically connected to a PC board 10 (FIGS. 1, 2, 4 and 6 to 8). A thermally conductive front panel 11 (FIGS. 1, 2, 4, 7 and 9) is in proximity with the front surface 2 of the display 1 and surrounds the front surface 2. The front Panel 11 has a multiplicity of windows 12 formed therethrough to accommodate the LED displays 1 (FIG. 9) and also has a plurality of extending parts or protrusions 13 on its under surface 14, as shown in FIG. 9.

Figure 8:
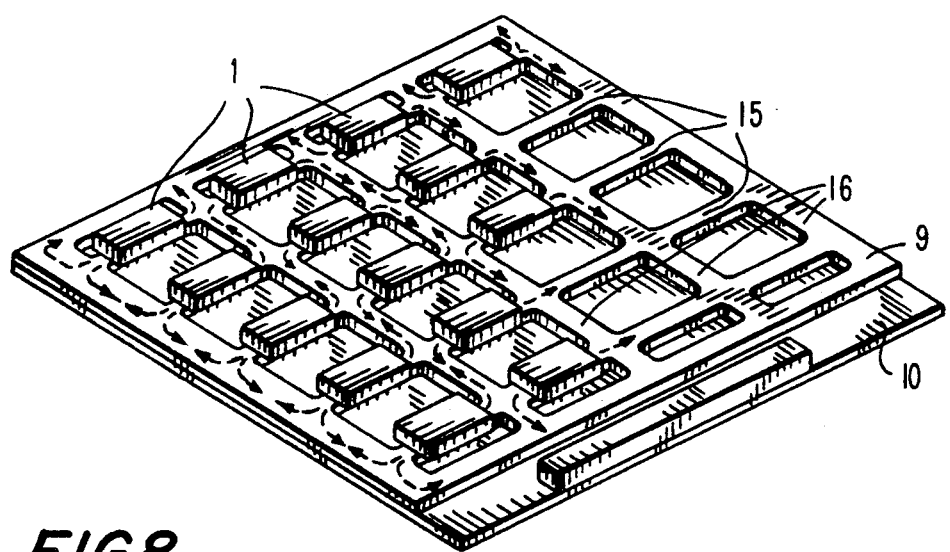
FIG. 8 is a perspective view, on a reduced scale, of the heat-dissipating device of the invention without the front panel.
Figure 9:
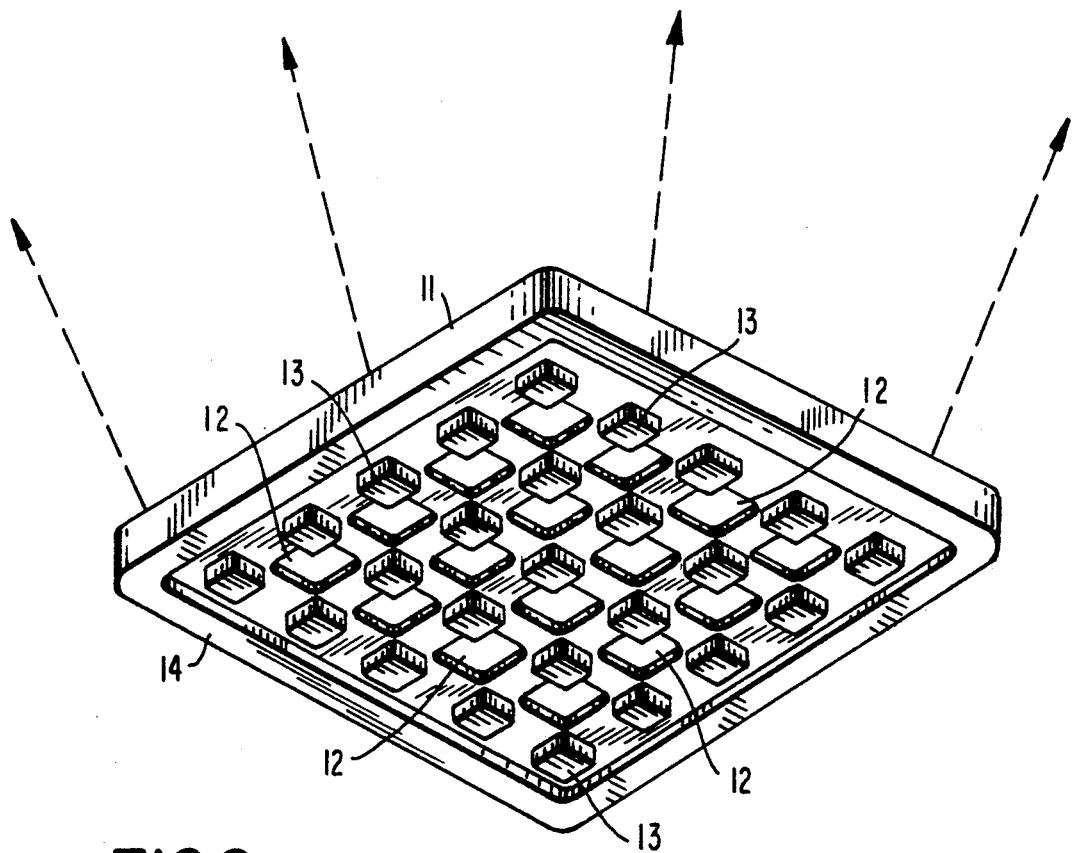
FIG. 9 is a perspective view, on a reduced scale, of an embodiment of the front panel.

The heatsink 9 comprises a first plurality of spaced substantially parallel heat conducting elements 15 and a second plurality of spaced substantially parallel heat conducting elements 16 substantially perpendicular to the first plurality of elements and substantially coplanar therewith, as shown in FIGS. 5 and 8.

Heat conducted from the under surface 3 of the LED display 1 is transmitted through the adhesive 7, the alumnia 4 and the tape 8 to the heatsink 9. Multiple LED displays, as shown in FIGS. 2 and 4 to 8, are more widely used than single LED displays and generate considerably more heat than single LED displays (FIGS. 1 and 3). The additional heat generated must be dissipated from the heatsink 9 and is dissipated, in accordance with the invention, via the front panel 11.

Figure 4:
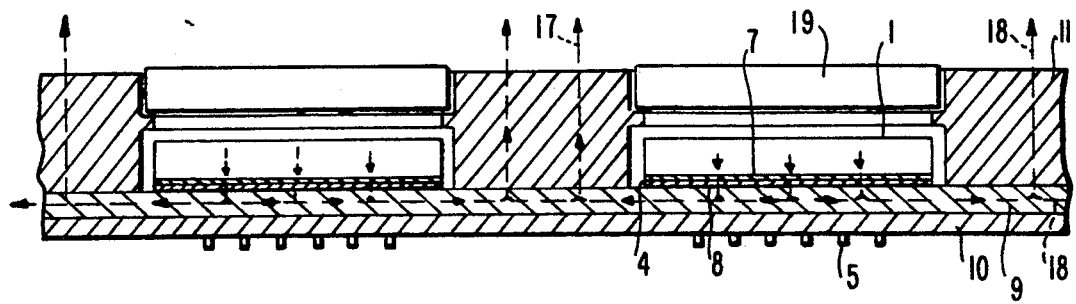
FIG. 4 is a cross-sectional view, on an enlarged scale, of the embodiment of FIG. 2 in a plane at substantially right angles to the plane of the section of FIG. 2.

The front panel 11 is placed above the displays 1, as shown in FIGS. 2, 4, 7 and 9 and also functions as a protective shroud. The protrusions 13 on the under surface 14 of the front panel 11 (FIG. 9) extend downward and make thermal contact with the heatsink 9 in a multiplicity of places. The protrusions 13 provide effective paths substantially perpendicular to the heatsink 9 through which the heat dissipates to the front panel 11 and thence to the outside, or immediate environment. These heat-dissipating paths are indicated in FIGS. 1, 2 and 4 by broken lines 17 and 18. The LED display 1 is viewed through a window 19 (FIGS. 2, 4 and 7) of transparent material.

Each heat-dissipating device of the invention shown in FIGS. 2 and 4 to 8 wherein a plurality of such devices are depicted, is substantially identical to the others of said devices.

The method of the invention comprises the step of thermally bonding the strip of alumina 4 to the under surface 3 of the LED display 1 via the thermally conductive adhesive 7. The front surface 2 of the display 1 is then provided in proximity with and surrounded by the thermally conductive front panel 11. The double sided, thermally conductive, pressure-sensitive tape 8 is bonded to the under surface of the alumina 4 and the heatsink 9 is bonded to said tape. This thermally bonds the heatsink 9 to the alumina 4 and places said heatsink in thermal contact with the front panel 11 for dissipating heat from the LED display 1 via said alumina, said heatsink and said front panel.

Although shown and described in what is believed to be the most practical and preferred embodiment, it is apparent that departures from the specific method and design described and shown will suggest themselves to those skilled in the art and may be made without departing from the spirit and scope of the invention. I, therefore, do not wish to restrict myself to the particular construction described and illustrated, but desire to avail myself of all modifications that may fall within the scope of the appended claims.

I claim:

1. A heat-dissipating device, said device having a LED display having a front surface and a spaced opposite under surface, said heat-dissipating device comprising
   a strip of alumina thermally bonded to the under surface of said display;
   a thermally conductive front panel in proximity with the front surface of said display; and
   a heatsink thermally bonded to said alumina via double sided, thermally conductive pressure-sensitive tape and in thermal contact with said front panel for dissipating heat from said display via said alumina, said heatsink and said front panel.

2. A heat-dissipating device as claimed in claim 1, wherein said front panel surrounds said front surface.

3. A heat-dissipating device as claimed in claim 1, wherein said heatsink comprises a heat distribution grid having a first plurality of spaced substantially parallel heat conducting elements and a second plurality of spaced substantially parallel heat conducting elements substantially perpendicular to said first plurality of elements and substantially coplanar therewith.

4. A heat-dissipating device, said device having a LED display having a front surface and a spaced opposite under surface, said heat-dissipating device comprising
   a strip of alumina;
   a thermally conductive adhesive thermally bonding said alumina to the under surface of said display;
   a thermally conductive front panel in proximity with the front surface of said display;
   a heatsink in thermal contact with said front panel; and
   double sided, thermally conductive pressure-sensitive tape bonding said heatsink to said alumina whereby said heatsink dissipates heat from said display via said alumina, said heatsink and said front panel.

5. A heat-dissipating device as claimed in claim 4, wherein said front panel surrounds said front surface.

6. A heat-dissipating device as claimed in claim 4, wherein said heatsink comprises a heat distribution grid having a first plurality of spaced substantially parallel heat conducting elements and a second plurality of spaced substantially parallel heat conducting elements substantially perpendicular to said first plurality of elements and substantially coplanar therewith.

7. A method of dissipating heat from a device, said device having a LED display having a front surface and a spaced opposite under surface, said method comprising the steps of
   thermally bonding a strip of alumina to the under surface of said display;
   providing a thermally conductive front panel in proximity with the front surface of said display; and
   thermally bonding a heatsink to said alumina via double sided thermally conductive pressure-sensitive tape and placing said heatsink in thermal contact with said front panel for dissipating heat from said display via said alumina, said heatsink and front panel.

8. A method as claimed in claim 7, wherein said front surface is surrounded by said front panel.

* * * * *